(12) United States Patent
Shindo et al.

(10) Patent No.: US 7,241,995 B2
(45) Date of Patent: Jul. 10, 2007

(54) ELECTRON MICROSCOPE EQUIPPED WITH MAGNETIC MICROPROBE

(75) Inventors: Daisuke Shindo, Miyagi (JP);
Yasukazu Murakami, Miyaki (JP);
Tetsuo Oikawa, Tokyo (JP); Masao Inoue, Tokyo (JP)

(73) Assignees: Tohoku University, Miyagi (JP); JEOL Ltd., Tokyo (JP)

( * ) Notice: Subject to any disclaimer, the term of this patent is extended or adjusted under 35 U.S.C. 154(b) by 27 days.

(21) Appl. No.: 11/134,090

(22) Filed: May 20, 2005

(65) Prior Publication Data

US 2005/0274889 A1 Dec. 15, 2005

(30) Foreign Application Priority Data

May 21, 2004 (JP) .............................. 2004-152286

(51) Int. Cl.
*G21K 7/00* (2006.01)
(52) U.S. Cl. ....................... 250/310; 250/311; 250/306; 250/307; 250/550; 250/492.1; 250/492.3; 369/126; 73/105
(58) Field of Classification Search .................... None
See application file for complete search history.

(56) References Cited

U.S. PATENT DOCUMENTS 5,196,701 A * 3/1993 Foster et al. ................. 250/306
5,811,806 A 9/1998 Honda et al.
6,759,656 B2 * 7/2004 Tomita ........................ 250/311
6,817,231 B2 * 11/2004 Yasutake et al. .............. 73/105

FOREIGN PATENT DOCUMENTS

| JP | 08-096737 | 4/1996 |
| JP | 09-080199 | 3/1997 |
| JP | 2002-117800 | 4/2002 |

OTHER PUBLICATIONS

Bunsen Y. Wong et al., "Direct Observation of Domain Walls in NiFe Films Using High-Resolution Lorentz Microscopy", *J. Appl. Phys.*, 79 (8), Apr. 15, 1996, pp. 6455-6457.
Marc De Graef et al., "In-situ Lorentz TEM Cooling Study of Magnetic Domain Configurations in $Ni_2MnGa$", *IEEE Transactions on Magnetics*, vol. 37, No. 4, Jul. 2001, pp. 2663-2665.

* cited by examiner

*Primary Examiner*—Robert Kim
*Assistant Examiner*—Zia R. Hashmi
(74) *Attorney, Agent, or Firm*—The Webb Law Firm (57) ABSTRACT

There is disclosed an electron microscope equipped with a magnetic microprobe. The microscope can apply a strong electric field to a local area on a specimen made of a magnetic material. The magnetic flux density per unit area of the microprobe is high. The microscope includes a biprism for producing interference between an electron beam transmitted through the specimen and an electron beam passing through a vacuum. The specimen is held to a holder. The microprobe is made of a magnetic material and has a needle-like tip. The microscope further includes a moving mechanism capable of moving the microprobe toward and away from the specimen.

7 Claims, 5 Drawing Sheets

| Specimen | Coercivity Hc (kA/m) | Remanence Br (T) | Energy product (BH)max (kJ/m³) |
|---|---|---|---|
| Annealed at 863 K | 115.4 | 1.21 | 43.4 |
| Annealed at 893 K | 281.9 | 1.15 | 89.1 |
| Annealed at 983 K | 247.5 | 1.03 | 57.7 |

ELECTRON MICROSCOPE EQUIPPED WITH MAGNETIC MICROPROBE

BACKGROUND OF THE INVENTION

1. Field of the Invention

The present invention relates to an electron microscope equipped with a magnetic microprobe.

2. Description of Related Art

In the prior art, in a transmission electron microscope, a specimen has been observed by directing an electron beam at the specimen such that the beam is transmitted through the specimen to create a specimen image, magnifying the specimen image by a magnetic lens, and projecting the image onto a screen. A technique for inserting a biprism into such a conventional transmission electron microscope is known as described, for example, in Japanese Patent Laid-Open No. 2002-117800 (pages 3 and 4; FIG. 1). The biprism creates interference fringes (hologram) by interference between the electron beam passing through a vacuum and the beam transmitted through the specimen. Information about variations in the phase of the beam is taken from the hologram. Information about the thickness distribution across the specimen, the electric field, or the magnetic field is obtained.

Furthermore, a technique utilizing a mechanism for removing contamination from a wire forming such a biprism is known (see, for example, Japanese Patent Laid-Open No. H9-80199 (pages 2, 3, and 4; FIG. 2)).

In a further known technique, a magnetic field application means is installed between the polepieces of the objective lens of an electron microscope. A DC current produced by a magnetic field application power supply or an AC current having an arbitrary phase, period, or amplitude is applied to the magnetic field application means with an arbitrary synchronizing signal to obtain information about magnetic domain structure while observing an electron microscope image of a magnetic material to which a magnetic field is applied (see, for example, Japanese Patent Laid-Open No. H8-96737 (pages 2 and 3; FIG. 1)).

In the prior art electron microscope, an external magnetic field is applied to a magnetic material to induce variations in the magnetic field inside and near the specimen. The induced variations are observed by application of a magnetic field. The following methods are available to apply this magnetic field.

1. The magnetic field produced by the objective lens of the electron microscope is used as the field applied to the specimen.

2. A coil used only for the application of the magnetic field is mounted either in the specimen chamber of the microscope or in a specimen holder.

Figure 8:
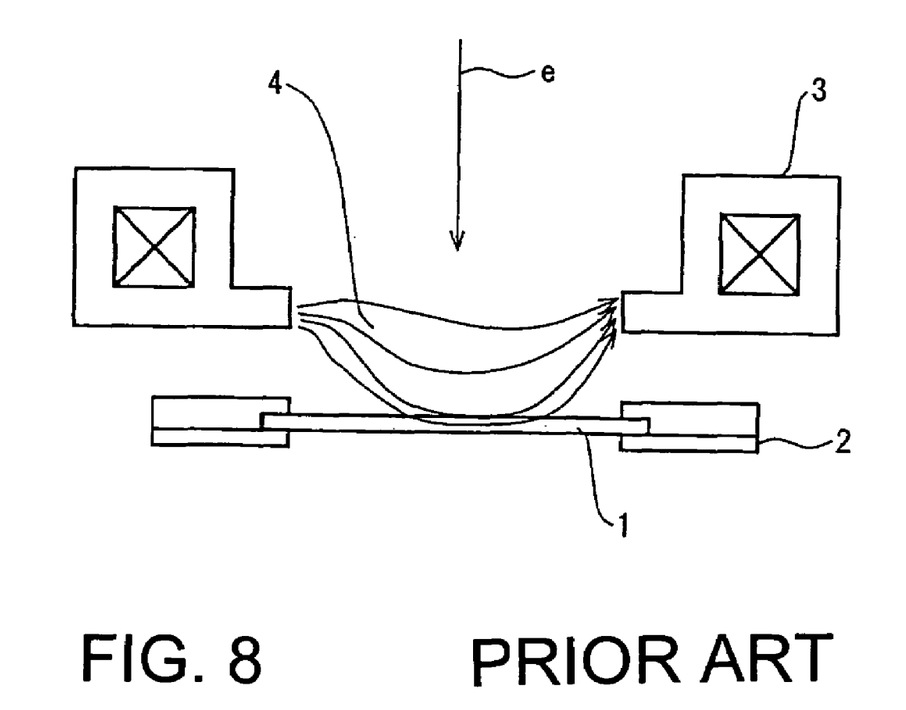
FIG. 8 is a diagram illustrating the prior art method of applying a magnetic field to a specimen.

FIG. 8 illustrates the prior art method of applying a magnetic field to a specimen. The specimen, indicated by numeral 1, is made of a magnetic material and held by a specimen holder 2. An excitation coil 3 is used to apply a magnetic field to the specimen 1. Indicated by e is an electron beam. Magnetic flux going out of the N pole of the excitation coil 3 enters the exciting coil 3 on the S-pole side. At this time, the magnetic flux 4 produced by the excitation coil 3 for producing a magnetic field penetrates through the specimen 1 of magnetic material, thus applying a magnetic field to the specimen 1. The beam e is directed at the specimen 1.

In the above-described prior art method, the magnetic field produced by the excitation coil is applied to the specimen of magnetic material. With this method, a substantially uniform magnetic field is applied to the whole specimen. However, if the applied magnetic field is strong (e.g., more than hundreds of gauss), the incident electron beam is deflected to a great extent by the magnetic field because the uniform magnetic field is applied over a wide range and over the whole specimen in this way. That is, with the prior art method described above, a strong magnetic field cannot be applied to the specimen of magnetic material. Consequently, imaging under environments of such strong magnetic fields cannot be performed.

SUMMARY OF THE INVENTION

It is an object of the present invention to provide an electron microscope which is equipped with a magnetic microprobe producing a high magnetic flux density per unit area and which can apply a strong magnetic field to a local area on a specimen of a magnetic material such that an electron beam incident on the specimen is hardly deflected.

A first embodiment of the present invention lies in an electron microscope designed to create an image of a specimen made of a magnetic material according to an electron beam transmitted through the specimen. The microscope has a nonmagnetic holder for holding the specimen, a magnetic microprobe having a needle-like tip and made of a magnetic material, and a moving mechanism capable of moving the microprobe toward and away from the specimen.

A second embodiment of the present invention lies in an electron microscope equipped with a biprism for producing interference between an electron beam transmitted through a specimen made of a magnetic material and an electron beam passing through a vacuum. Data about an image created by the beam transmitted through the biprism is accepted and subjected to given image processing. Thus, a holographic image of the specimen is obtained.

A third embodiment of the present invention is based on the first embodiment and further characterized in that the image of the specimen is processed to obtain a Lorentz image.

A fourth embodiment of the present invention is based on the first embodiment and further characterized in that the magnetic microprobe uses a permanent magnet.

A fifth embodiment of the present invention is based on the first embodiment and further characterized in that the magnetic microprobe is equipped with a mechanism that uses an electromagnet to vary the strength of the produced magnetic field.

A sixth embodiment of the present invention is based on the first embodiment and further characterized in that the moving mechanism for varying the strength uses as its power source an electric motor or piezoelectric device.

A seventh embodiment of the present invention is based on the first embodiment and further characterized in that the specimen made of magnetic material is carried on a drive mechanism for driving the specimen in X-, Y-, and Z-directions. The magnetic microprobe is carried on a drive mechanism for driving the microprobe in the X-, Y-, and Z-directions.

According to the first embodiment of the present invention, an arbitrary part of the area on the specimen of magnetic material can be magnetized. The electron beam incident on the specimen is little deflected by the applied magnetic field. Image data about the part of the area can be obtained.

According to the second embodiment of the present invention, a holographic image of the specimen of magnetic material can be obtained by performing given computational processing, such as Fourier transform on the accepted image. Consequently, characteristics of the magnetic material can be analyzed.

According to the third embodiment of the present invention, a Lorentz image can be obtained.

According to the fourth embodiment of the present invention, the permanent magnet can be used as the magnetic microprobe. In consequence, the structure of the magnetic microprobe can be made simpler.

According to the fifth embodiment of the present invention, the strength of the magnetic field can be adjusted by using the electromagnet as the magnetic microprobe.

According to the sixth embodiment of the present invention, the microprobe can be moved using the motor or piezoelectric device.

According to the seventh embodiment of the present invention, the specimen of magnetic material and the magnetic microprobe can be independently driven in the X-, Y-, and Z-directions. Therefore, the positions of the specimen and microprobe can be varied precisely.

Other objects and features of the present invention will appear in the course of the description thereof, which follows.

DESCRIPTION OF THE PREFERRED EMBODIMENTS

The preferred embodiments of the present invention are hereinafter described with reference to the accompanying drawings.

Figure 1:
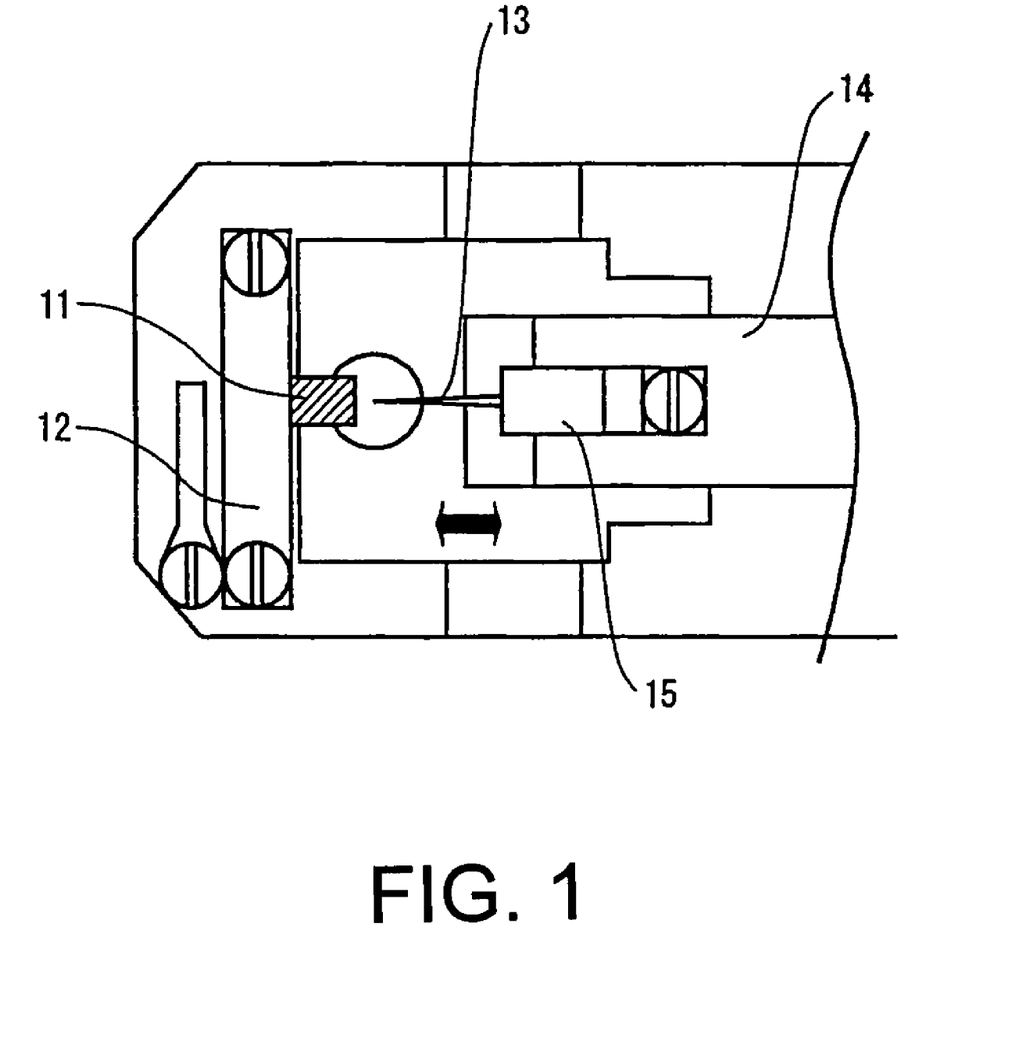
FIG. 1 is a diagram illustrating an example of the structure of a microprobe according to the present invention.

FIG. 1 shows an example of the structure of a microprobe according to the present invention. This microprobe has a specimen holder 12. FIG. 1 is a top view as taken from above the holder. A specimen 11 made of a magnetic material is held to the specimen holder 12. A magnetic microprobe 13 (hereinafter may be referred to as the probe) is made of a magnetic material and has a needle-like tip. In this embodiment, the probe 13 is made of a permanent magnet. The diameter of the tip of the probe 13 is about 1 µm. The probe 13 is held by a probe-holding portion 15 which, in turn, is held to a specimen stage 14 capable of moving in the direction indicated by the arrows. That is, the specimen stage 14 can move toward and away from the specimen. The operation of the microprobe constructed in this way is described below.

The specimen 11 made of magnetic material is held to the specimen holder 12 as described previously. The probe 13 is moved and brought to a stop in an arbitrary position on the specimen 11. Since the tip of the probe 13 is sharp, the magnetic flux density is quite high. The portion of the specimen 11 over which the probe 13 rests is magnetized by bringing the probe 13 having such magnetic flux density into an arbitrary position over the specimen 11. To drive the probe 13, an electrically operated drive mechanism (such as a stepping motor or piezoelectric device) is used. The driving force of the drive mechanism can be controlled from the outside.

The illustrated mechanism is totally inserted in the specimen chamber of an electron microscope (not shown). The specimen 11 of magnetic material and the probe 13 are observed as electron microscope images at the same time. At this time, if Lorentz microscopy is used, magnetic domains and domain walls of the specimen 11 and probe 13 are observed. Furthermore, the distribution of magnetic flux can be observed on its reconstructed image if electron holography is used. While the specimen 11 and probe 13 are being observed with the electron microscope, the mechanism for driving the probe 13 is controlled from the outside of the microscope to move the probe toward or away from the specimen 11.

In this way, according to this embodiment, an arbitrary part of the specimen 11 of magnetic material can be magnetized and image data about this part can be obtained. Furthermore, the structure of the probe can be simplified by using a permanent magnet as the probe.

In the present invention, the specimen stage 14 can be driven to move the probe 13 toward or away from the specimen 11 of magnetic material as described previously. A stepping motor or piezoelectric device is used as the mechanism for driving the stage 14. In this case, movement of the probe 13 can be easily controlled from the outside.

Figure 2:
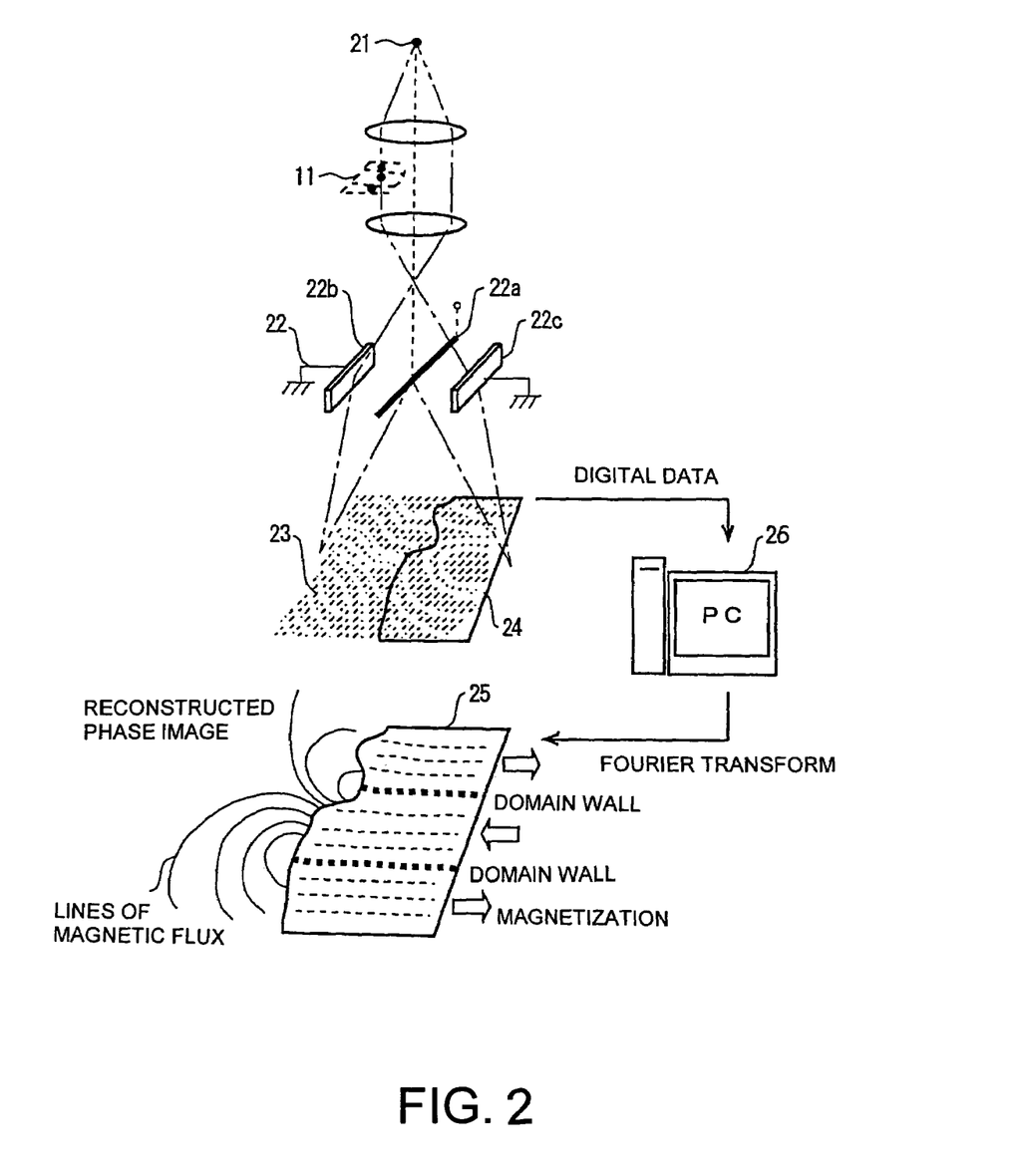
FIG. 2 is a diagram illustrating an example of the structure of an electron microscope according to the present invention.

FIG. 2 shows an example of the configuration of an electron microscope according to the present invention. This microscope consists of a transmission electron microscope and is operated to display a hologram. Like components are indicated by like reference numerals in both FIGS. 1 and 2. A field emission gun 21 emits an electron beam at a specimen 11 made of a magnetic material. The magnetic probe 13, as shown in FIG. 1, can be brought close to the specimen 11. As a result, a part of the area on the specimen 11 is magnetized by the probe 13. The specimen 11 magnetized in this way is irradiated with the electron beam.

A transmission image created by the electron beam is focused by the objective lens and then enters a biprism 22. The biprism 22 produces interference between the electron beam (reference wave) passing through a vacuum and electron beam (object wave) transmitted through the specimen, forming interference fringes. The biprism 22 includes a conductive wire 22a including a mechanism permitting either application of an electric field or grounding. Grounding electrodes 22b and 22c are disposed parallel to the conductive wire 22a and on the opposite sides of the wire 22a. The grounding electrodes 22b and 22c act to tailor the electric field produced across the conductive wire 22a. The operation of the instrument constructed in this way is described below.

In the instrument shown in FIG. 2, an imaging process based on digital computational analysis of electron holography is obtained. The analysis based on the electron holography consists of two imaging steps including a first step consisting of creating a hologram by the use of the biprism 22. The object wave (TEM image of the specimen) obtained by passage of a transmission electron beam through the specimen 11 of magnetic material interferes with the reference wave passing through a vacuum, resulting in a hologram.

In a second step, phase shift of electron waves (electron holography) is extracted from the hologram by Fourier transform and, thus, a phase-reconstructed image (holographic image) is obtained.

The electron beam radiated from the electron gun 21 is accelerated and focused by the condenser lens system. The transmission electron beam passed through the specimen is placed in position on a half of the object plane displayed by a collimated electron beam. When an electric field is applied to the conductive wire 22a, the electron beam passed through the biprism 22 creates an electron hologram 23 at interference fringes 24. This electron hologram is converted into an electrical signal by a photoelectric device and then converted into digital data by an A/D converter (not shown). The digital data, or image data, is input into a personal computer 26. In the computer 26, the input image data is processed in a given manner, e.g., Fourier transformed. A phase-reconstructed image (holographic image) 25 of the part of the area on the magnetized specimen 11 is obtained. Characteristics of the specimen 11 can be investigated by observing the holographic image 25.

In FIG. 2, the right half of the reconstructed image 25 is a holographic image, while the left half is an image not affected by the magnetic field. It can be seen that lines of magnetic force radiate out from the holographic image.

According to this embodiment, a holographic image of the specimen of magnetic material can be obtained by performing given processing (such as Fourier transform) on the accepted image. Characteristics of the specimen can be analyzed.

According to the present invention, a specimen holder is used. A sharp tip made of a material $Nd_2Fe_{14}B$ is driven using a stepping motor or piezoelectric device and brought close to a specimen of magnetic material. The hard magnetic material is magnetized. It is assumed here that the magnetic field produced by the probe tip is almost constant within the limited width of the field on the display screen. In particular, it is approximately 460 nm when the Lorentz objective lens is excited. This is sufficient for analysis utilizing electron holography.

Figure 3:
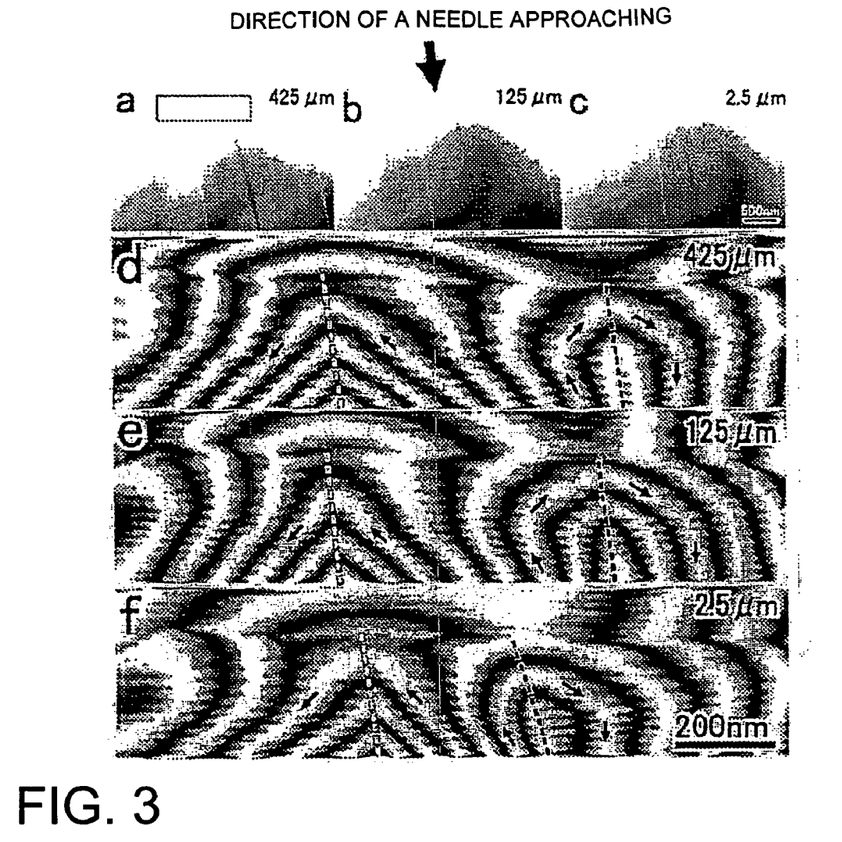
FIG. 3 shows images obtained by processing performed according to the present invention.

However, when the Lorentz objective lens is not excited, a relatively broad area is observed. Variations in the reference wave caused by variations in the magnetic field have an important meaning. FIG. 3 shows examples of images obtained by processing by a method according to the present invention. In FIG. 3, fields (a)-(c) show Lorentz microscope images, which are examples of half-tone photographs of the main window displayed on a display screen according to an embodiment of the present invention. Fields (d) to (f) of FIG. 3 show reconstructed images (holographic images) of a specimen of magnetic material $Nd_2Fe_{14}B$, respectively. The white and black stripes shown in fields (a) to (c) of FIG. 3 show magnetic domain walls of the specimen 11 of magnetic material. The distance between the probe and the specimen is indicated at the right end of each image.

A Lorentz microscope is now described. A case in which a magnetized specimen of magnetic material is irradiated with an electron beam is now discussed. It can be considered that the magnetized specimen is a collection of tiny magnets each consisting of N and S poles. Among these magnets, magnetic flux flows from N to S pole. An electron beam is affected by the magnetic field and deflected. The space is divided into first spatial parts against which the beam transmitted through the magnets collides and second spatial parts where there is no electron beam. In the first spatial parts, the image is brighter. In the second spatial parts, the image is darker. Since magnetic domain walls create these brighter and darker portions of the image, Lorentz microscopy can detect magnetic domain walls of a magnetic material. According to this embodiment, the biprism is retracted from the optical axis when a Lorentz image is obtained. An image created by the beam transmitted through the specimen is processed, thus producing a Lorentz image.

Fields (d) to (f) of FIG. 3 show phase images (holographic images) reconstructed in cases where $Nd_2Fe_{14}B$ magnetic substance is used. These phase images of fields (d) to (f) are holographic images created by a method according to the present invention. In the figures, the direction of flow of the magnetic flux is indicated by the arrows. Each numerical value in the figures indicates the distance between the specimen 11 of magnetic material and probe 13. Characteristics of the specimen can be investigated by obtaining these images. The reconstructed phase images indicate that the phases of the magnetic walls (indicated by white and black dots) have been shifted by the magnetic field produced by the probe 13. In these locations, the distance between the probe 13 and the specimen 11 is reduced further. This is interpreted in such a way that the created magnetic field pushes the magnetic domain walls perpendicularly. It can also be seen from the figures that the magnetized domains have grown in a direction parallel to the probe. On the other hand, magnetized domains in antiparallel directions have shrunk gradually.

Figure 4:
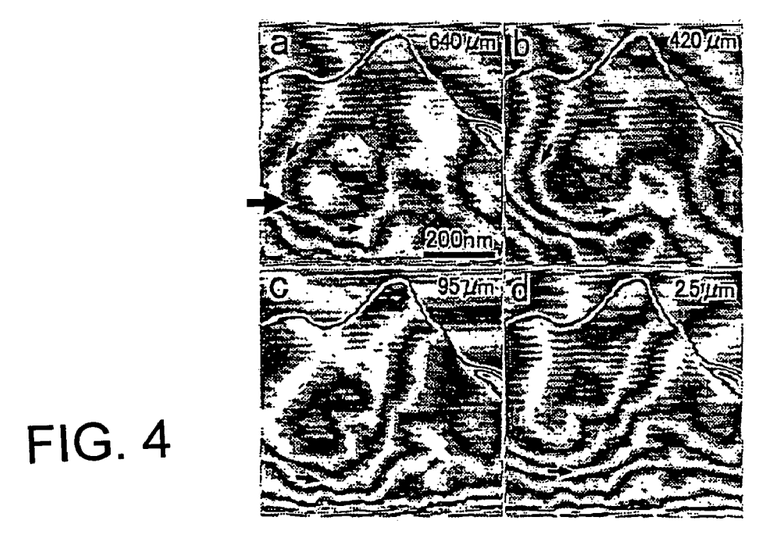
FIG. 4 shows images obtained by other processing performed according to the present invention.
Figure 5:
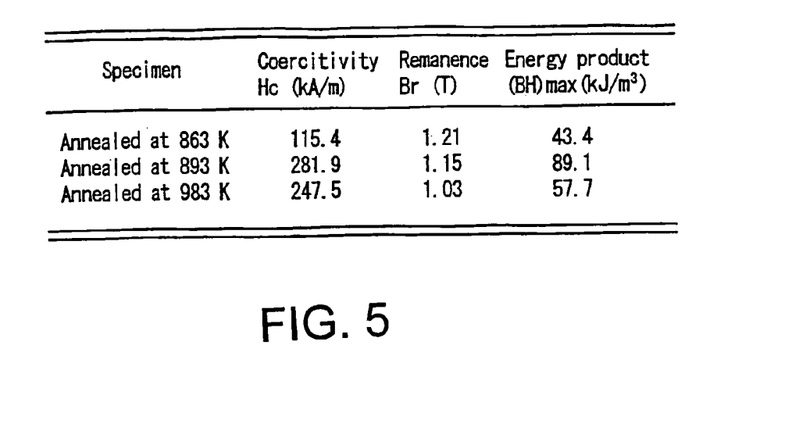
FIG. 5 is a table illustrating characteristics of a specimen made of a magnetic material.

FIG. 4 shows a result of an experiment made when a microscopic material of $Nd_{4.5}Fe_{77}B_{18.5}$ was annealed to 983 K. Experiments were performed on the specimen of magnetic material to obtain its magnetic property, which is shown in the table of FIG. 5. FIG. 4 shows a holographic image obtained from $Nd_{4.5}Fe_{77}B_{18.5}$ that is a microscopic synthetic after annealing it to 983 K. The distance between the probe and the specimen of magnetic material is shown in the figure. The bold arrow indicates the direction in which the probe approaches the specimen.

Since the distance between the probe and the specimen of magnetic material is small, the magnetic flux distribution in the reconstructed phase image varies slightly. The density of the lines of magnetic flux is found to be lesser near the specimen edge and the central portion of the image. This may be the result of radiation damage due to ion milling.

However, the direction of magnetic flux has the property that as the probe approaches the specimen, the direction of the magnetic flux becomes parallel to the magnetic field as shown in the lower part of field (a) of FIG. 4.

The sharpened probe produces a magnetic field around the specimen 11 of magnetic material. The magnetic field is not yet measured accurately but the magnetic domain walls and magnetic flux are created by the probe made of $Nd_2Fe_{14}B$. A measurement has shown that the probe can be moved in response to the magnetic field produced in the boundary region of the magnetic flux owing to $Nd_2Fe_{14}B$. This movement is controlled by a stepping motor or piezoelectric device. It seems that a specimen holder having a sharpened probe and a piezoelectric device clarifies the magnetization process of a hard magnetic material.

Figure 6A:
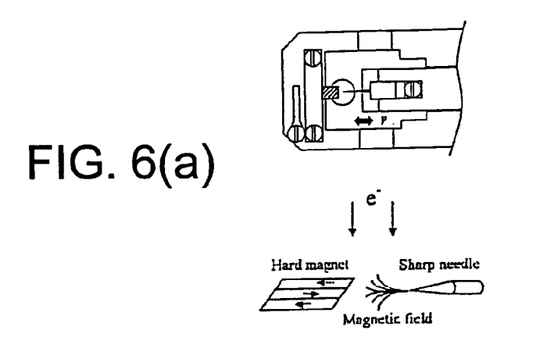
FIG. 6(a) shows a manner in which a specimen made of a magnetic material is magnetized.
Figure 6B:
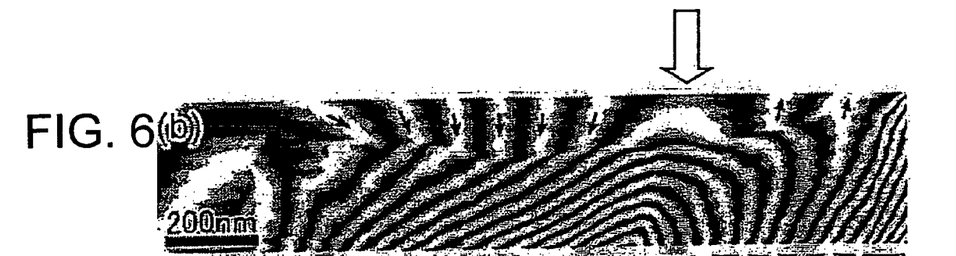
FIGS. 6(b) and 6(c) show holographic images.
Figure 6C:
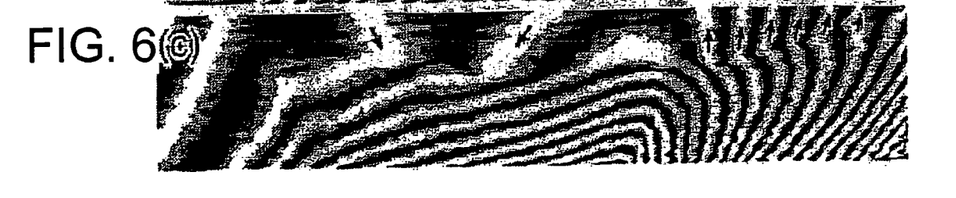

To observe the magnetization process of a hard magnetic material, a probe having a sharpened tip and made of a permanent magnet of magnetic material $Nd_2Fe_{14}B$ producing a strong magnetic field was fabricated. As shown in FIG. 6(a), the probe was set in the specimen holder driven by a stepping motor or piezoelectric device. An obtained hologram was reconstructed into a phase image by computer processing, resulting in holographic images as shown in FIGS. 6B and 6C. FIGS. 6B and 6C show holographic images of the specimen of magnetic material. FIG. 6(b) shows the characteristics of the probe in a case where it is located remotely from the specimen surface of the magnetic material. FIG. 6(c) shows the characteristics of the probe in a case where it is located close to the specimen surface. The direction in which the probe approaches is indicated by the arrow on top of FIG. 6(b). The arrows shown within FIGS. 6(b) and 6(c) indicate the directions of magnetic fluxes.

Inner and outer magnetic fluxes within the specimen of magnetic material vary gradually as the S pole of the probe approaches the specimen surface. This demonstrates that clarifying the magnetization process using a hard magnetic material by electron holography is quite advantageous. However, the strong magnetic field created by the probe is limited to a restricted area in the specimen.

In the embodiment described above, the probe is moved by the specimen stage capable of moving the probe toward a specimen of magnetic material. However, the present invention is not limited to this embodiment. For example, the specimen stage to which a specimen of magnetic material is held may be carried on a mechanism capable of moving in the X-, Y-, and Z-directions. Also, the probe may be carried on a mechanism capable of moving in the X-, Y-, and Z-directions. As a result, the positions of the specimen and probe can be varied precisely by driving them independently in the X-, Y-, and Z-directions.

Figure 7:
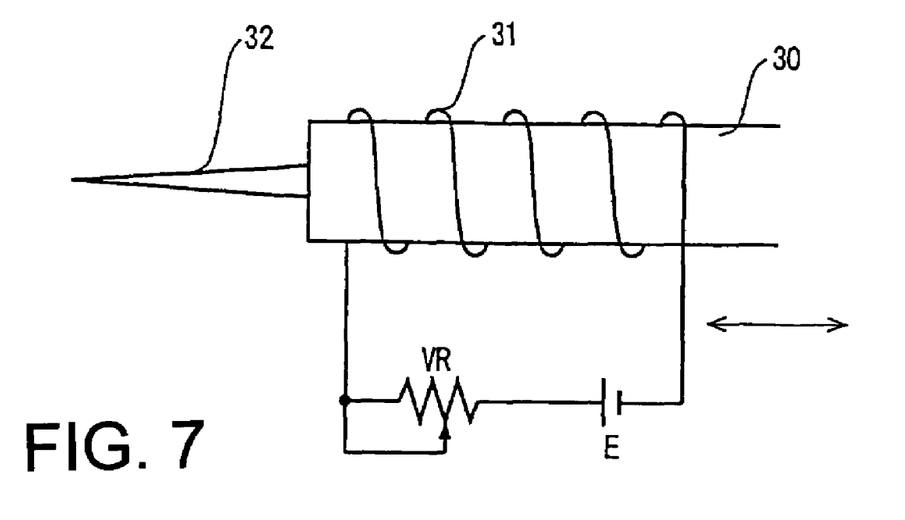
FIG. 7 is a diagram illustrating a magnetized microprobe using an electromagnet, the microprobe being built in accordance with the present invention.

FIG. 7 shows another example of configuration of a magnetic microprobe using an electromagnet. A rod 30 is made of a magnetic material. An exciting coil 31 is wound around the rod 30. A probe 32 is mounted at one end of the rod 30. Indicated by E is a DC voltage source. A variable resistor VR is connected with one end of the exciting coil 31. The rod 30 of magnetic material and the exciting coil 31 (solenoid coil) cooperate to form a solenoid. One end of the DC voltage source E is connected with the exciting coil 31, while the other end is connected with the variable resistor VR. That is, the DC voltage E is applied to the series circuit consisting of the exciting coil 31 and variable resistor VR. The shown probe 32 can be moved in the direction indicated by the arrow together with the solenoid. The operation of the probe constructed in this way is described below.

When the DC voltage E is applied to the circuit shown in FIG. 7, an electrical current flows through the solenoid coil 31. The rod of magnetic material shown acts as an electromagnet. As a result, a quite strong magnetic field is produced at the tip of the probe 32. Accordingly, a part of the area on the specimen can be magnetized by bringing the probe 32 closer to the specimen. According to this embodiment, the variable resistor VR is mounted and so the magnitude of the excitation, i.e., the strength of the magnetic field, can be varied by varying the resistance value of the variable resistor.

The probe shown in FIG. 7 is more complex in structure than the probe shown in FIG. 1 but has the feature that the strength of the magnetic field can be varied. In this way, according to this embodiment, the strength of the magnetic field can be adjusted by using an electromagnet as the magnetic microprobe.

As described in detail so far, according to the present invention, a probe made of a magnetic material and having a tip of 1-micron size is set into a specimen holder of an electron microscope. The distance between a specimen of magnetic material and the probe is made variable. Therefore, a strong magnetic field can be produced in a local area on the specimen. At the same time, the strength of the field can be varied. Magnetic characteristics and dynamical variations of the specimen can be observed.

The present invention can be utilized in fields related to electron microscopy, electron holography microscopy, and Lorentz microscopy.

Having thus described our invention with the detail and particularity required by the Patent Laws, what is desired protected by Letters Patent is set forth in the following claims.

The invention claimed is:

1. An electron microscope equipped with a magnetic microprobe, the microscope creating an image of a specimen made of a magnetic material based on an electron beam transmitted through the specimen, said microscope comprising:
   a nonmagnetic holder for holding said specimen made of the magnetic material;
   said magnetic microprobe being made of a magnetic material, the microprobe having a needle-like tip; and
   a moving mechanism capable of moving said microprobe toward and away from said specimen and brought to a stop.

2. An electron microscope equipped with a magnetic microprobe as set forth in claim 1, wherein there is further provided a biprism for producing interference between the electron beam transmitted through said specimen and an electron beam passing through a vacuum, and wherein a holographic image of said specimen may be obtained by accepting data about an image created by the electron beam transmitted through said biprism and performing given image processing on the accepted data.

3. An electron microscope equipped with a magnetic microprobe as set forth in claim 1, wherein said image of said specimen is processed to obtain a Lorentz image.

4. An electron microscope equipped with a magnetic microprobe as set forth in claim 1, wherein said magnetic microprobe uses a permanent magnet.

5. An electron microscope equipped with a magnetic microprobe as set forth in claim 1, wherein said magnetic microprobe uses an electromagnet and has a mechanism for varying the strength of a produced magnetic field.

6. An electron microscope equipped with a magnetic microprobe as set forth in claim 1, wherein said moving mechanism uses as its power source an electric motor or piezoelectric device.

7. An electron microscope equipped with a magnetic microprobe as set forth in claim 1, wherein said specimen is carried on a drive mechanism for driving the specimen in the X-, Y-, and Z-directions, and wherein said microprobe is carried on a drive mechanism for driving the microprobe in the X-, Y-, and Z-directions.

* * * * *

UNITED STATES PATENT AND TRADEMARK OFFICE
CERTIFICATE OF CORRECTION

PATENT NO.      : 7,241,995 B2
APPLICATION NO. : 11/134090
DATED           : July 10, 2007
INVENTOR(S)     : Shindo et al.

It is certified that error appears in the above-identified patent and that said Letters Patent is hereby corrected as shown below:

<u>Title Page</u>, See Item (75) Inventors, second inventor's residence "Miyaki (JP)" should read -- Miyagi (JP) --

Signed and Sealed this

Twentieth Day of November, 2007

JON W. DUDAS
*Director of the United States Patent and Trademark Office*